US010385236B2

(12) United States Patent
Reichardt et al.

(10) Patent No.: US 10,385,236 B2
(45) Date of Patent: Aug. 20, 2019

(54) USE OF A CHEMICAL MECHANICAL POLISHING (CMP) COMPOSITION FOR POLISHING OF COBALT AND / OR COBALT ALLOY COMPRISING SUBSTRATES

(71) Applicant: BASF SE, Ludwigshafen (DE)

(72) Inventors: Robert Reichardt, Ludwigshafen am Rhein (DE); Max Siebert, Ludwigshafen (DE); Yongqing Lan, Ludwigshafen (DE); Michael Lauter, Mannheim (DE); Sheik Ansar Usman Ibrahim, Heverlee (BE); Reza Golzarian, Portland, OR (US); Haci Osman Guevenc, Heidelberg (DE); Julian Proelss, Worms (DE); Leonardus Leunissen, Ludwigshafen (DE)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 15/538,851

(22) PCT Filed: Dec. 22, 2015

(86) PCT No.: PCT/EP2015/080913
§ 371 (c)(1),
(2) Date: Jun. 22, 2017

(87) PCT Pub. No.: WO2016/102531
PCT Pub. Date: Jun. 30, 2016

(65) Prior Publication Data
US 2017/0362464 A1 Dec. 21, 2017

Related U.S. Application Data

(60) Provisional application No. 62/095,086, filed on Dec. 22, 2014.

(51) Int. Cl.
*H01L 21/461* (2006.01)
*C09G 1/02* (2006.01)
(Continued)

(52) U.S. Cl.
CPC .............. *C09G 1/02* (2013.01); *B24B 37/20* (2013.01); *C09K 3/1409* (2013.01); *C23F 3/06* (2013.01);
(Continued)

(58) Field of Classification Search
None
See application file for complete search history.

(56) References Cited

U.S. PATENT DOCUMENTS

| 5,230,833 A | 7/1993 | Romberger et al. |
| 9,138,381 B2 | 9/2015 | Kempter et al. |

(Continued)

FOREIGN PATENT DOCUMENTS

| EP | 2 502 969 A1 | 9/2012 |
| JP | 2013-42123 A | 2/2013 |

(Continued)

OTHER PUBLICATIONS

Timo Kuntzsch, et al., "Characterization of Slurries Used for Chemical-Mechanical Polishing (CMP) in the Semiconductor Industry", Chemical Engineering Technology, vol. 26, Issue 12, 2003, pp. 1235-1239.

(Continued)

*Primary Examiner* — Stephanie P Duclair
(74) *Attorney, Agent, or Firm* — Oblon, McClelland, Maier & Neustadt, L.L.P.

(57) ABSTRACT

A chemical mechanical polishing (CMP) composition (Q) for chemical mechanical polishing of a substrate (S) containing (i) cobalt and/or (ii) a cobalt alloy, wherein the CMP composition (Q) contains: (A) Inorganic particles, (B) a
(Continued)

Figure 1:
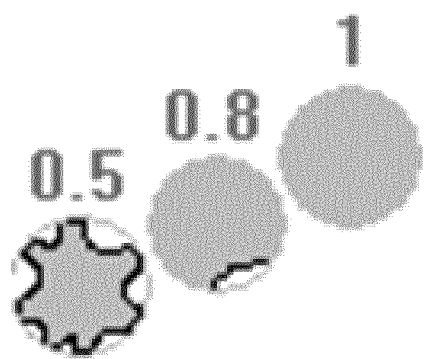

substituted aromatic compound with at least one carboxylic acid function as corrosion inhibitor, (C) at least one amino acid, (D) at least one oxidizer, (E) an aqueous medium, wherein the CMP composition (Q) has a pH of from 7 to 10.

14 Claims, 2 Drawing Sheets

(51) Int. Cl.

| | | |
|---|---|---|
| H01L 21/306 | (2006.01) | |
| H01L 21/321 | (2006.01) | |
| H01L 21/302 | (2006.01) | |
| H01L 21/304 | (2006.01) | |
| H01L 21/463 | (2006.01) | |
| B24B 37/20 | (2012.01) | |
| C09K 3/14 | (2006.01) | |
| C23F 3/06 | (2006.01) | |
| H01L 21/768 | (2006.01) | |

(52) U.S. Cl.
CPC .......... *H01L 21/302* (2013.01); *H01L 21/304* (2013.01); *H01L 21/30625* (2013.01); *H01L 21/3212* (2013.01); *H01L 21/32115* (2013.01); *H01L 21/461* (2013.01); *H01L 21/463* (2013.01); *H01L 21/7684* (2013.01)

(56) References Cited

U.S. PATENT DOCUMENTS

| | | | |
|---|---|---|---|
| 9,765,239 | B2 | 9/2017 | Lan et al. |
| 9,828,527 | B2 | 11/2017 | Lan et al. |
| 2005/0090104 | A1 | 4/2005 | Yang et al. |
| 2008/0003829 | A1 | 1/2008 | Shin et al. |
| 2009/0001051 | A1* | 1/2009 | Lee .......... C09G 1/02 216/53 |
| 2009/0215269 | A1 | 8/2009 | Boggs et al. |
| 2010/0015807 | A1 | 1/2010 | Kim et al. |
| 2010/0068883 | A1 | 3/2010 | Shin et al. |
| 2013/0186850 | A1* | 7/2013 | Wang .......... C09K 3/1463 216/13 |
| 2015/0118845 | A1 | 4/2015 | Noller et al. |

FOREIGN PATENT DOCUMENTS

| | | |
|---|---|---|
| JP | 2014-229827 A | 12/2014 |
| WO | WO 2004/063301 A1 | 7/2004 |
| WO | WO 2006/133249 A2 | 12/2006 |
| WO | WO 2008/078909 A1 | 7/2008 |
| WO | WO 2008/082177 A1 | 7/2008 |

OTHER PUBLICATIONS

U.S. Appl. No. 14/824,207, filed Aug. 12, 2015, US 2015/0342887 A1, Andreas Kempter et al.
U.S. Appl. No. 15/502,932, filed Feb. 9, 2017, US 2017/0226381 A1, Yongqing Lan et al.
U.S. Appl. No. 14/905,703, filed Jan. 15, 2016, US 2016/0200943 A1, Robert Reichardt et al.
U.S. Appl. No. 14/905,635, filed Jan. 15, 2016, US 2016/0160083 A1, Michael Lauter et al.
U.S. Appl. No. 14/768,825, filed Aug. 19, 2015, US 2015/0380263 A1, Yongqing Lan et al.
U.S. Appl. No. 14/770,185, filed Aug. 25, 2015, US 2016/0009955 A1, Yongqing Lan et al.
U.S. Appl. No. 14/891,175, filed Nov. 13, 2015, US 2016/0068712 A1, Yongqing Lan et al.
U.S. Appl. No. 15/115,747, filed Aug. 1, 2016, US 2017/0166778 A1, Michael Lauter et al.
U.S. Appl. No. 15/113,589, filed Jul. 22, 2016, US 2017-0022107 A1, Max Siebert et al.
U.S. Appl. No. 15/325,464, filed Jan. 11, 2017, US 2017/0158913 A1, Robert Reichardt et al.
U.S. Appl. No. 15/538,313 filed Aug. 21, 2017, Robert Reichardt et al.
U.S. Appl. No. 15/538,334, filed Jun. 21, 2017, Robert Reichardt et al.
International Search Report and Written Opinion of the International Searching Authority dated Mar. 7, 2016 in PCT/EP2015/080913 filed Dec. 22, 2015.
International Preliminary Report on Patentability dated Jun. 27. 2017 in PCT/EP2015/080913 filed Dec. 22, 2015.

* cited by examiner

USE OF A CHEMICAL MECHANICAL POLISHING (CMP) COMPOSITION FOR POLISHING OF COBALT AND / OR COBALT ALLOY COMPRISING SUBSTRATES

This invention essentially relates to the use of a chemical mechanical polishing (CMP) composition comprising inorganic particles, a substituted aromatic compound with at least one carboxylic acid function as a corrosion inhibitor, at least one amino acid, at least one oxidizer and an aqueous medium for polishing substrates of the semiconductor industry comprising cobalt and/or a cobalt alloy. The present invention also relates to a process for the manufacture of semiconductor devices comprising the chemical-mechanical polishing of a substrate or layer in the presence of said chemical-mechanical polishing (CMP) composition. The CMP composition shows an improved and adjustable etching behavior with regard to cobalt and/or cobalt alloys and good polishing performance.

In the semiconductor industry, chemical mechanical polishing (abbreviated as CMP) is a well-known technology applied in fabricating advanced photonic, microelectromechanical, and micro-electronic materials and devices, such as semiconductor wafers.

During the fabrication of materials and devices used in the semiconductor industry, CMP is employed to planarize metal and/or oxide surfaces. CMP utilizes the interplay of chemical and mechanical action to achieve the planarity of the to-be-polished surfaces. Chemical action is provided by a chemical composition, also referred to as CMP composition or CMP slurry. Mechanical action is usually carried out by a polishing pad which is typically pressed onto the to-be-polished surface and mounted on a moving platen. The movement of the platen is usually linear, rotational or orbital.

In a typical CMP process step, a rotating wafer holder brings the to-be-polished wafer in contact with a polishing pad. The CMP composition is usually applied between the to-be-polished wafer and the polishing pad.

With the continuous shrink of feature size in ultra large scale integrated Circuits (ULSI) technology, the size of the copper interconnect structure is getting smaller and smaller. To reduce the RC delay, the thickness of barrier or adhesion layer in the copper interconnect structure is getting thinner. The traditional copper barrier/adhesion layer stack Ta/TaN is not suitable any more, as the resistivity of Ta is relatively high and copper cannot be directly electroplated onto Ta. Compared with Ta, cobalt has lower resistivity and is cheaper. The adhesion between Cu and Co is good. Cu can easily nucleate on Co, also copper can be directly electroplated on cobalt.

In integrated circuits, Co is used as adhesion or barrier layer for copper interconnects, while Co can also be used as nano-crystalline Co in memory device and as metal gate in MOSFET.

Porous low k dielectrics material has been already used in the current interconnect structures. It is reported that low k material can be easily damaged by plasma or polishing slurries. In current chemical mechanical polishing processing, to reduce the damage to low-k dielectrics, most of the current slurries used for copper and barriers are acidic. But it is observed that copper and cobalt easily suffered from dissolution in acidic solution containing oxidant for example hydrogen peroxide. This makes the polishing rate of copper and cobalt too high so that it will induce the dishing of copper lines. In addition the dissolution of the cobalt adhesion layer on the sidewall of the copper interconnect structure can lead to the delamination of copper lines and cause reliability problems.

The coexisting of Co, Cu and low k dielectric materials in different amounts and layer thickness depending on the used integration scheme in ultra large scale integrated Circuits (ULSI) technology gives up multiple challenges, in terms of selectivity, corrosion, removal rates and surface quality, to the compositions used for chemical mechanical polishing in the production of semiconductor devices.

In the state of the art, the use of CMP compositions comprising inorganic particles, carboxylic acid derivative, an oxidizer and an aqueous medium for polishing substrates of the semiconductor industry comprising cobalt are known and described, for instance, in the following reference.

JP 2013042123 discloses an abrasive for polishing a layer containing a cobalt element which contains a carboxylic acid derivative comprising at least one kind selected from the group consisting of a phthalic acid compound, an isophthalic acid compound, an alkyl dicarboxylic acid compound, salts and acid anhydrides thereof, a metal anticorrosive and water, and has a pH of 4.0 or less. To provide an abrasive excellent in corrosion inhibition performance for a cobalt layer while maintaining suitable polishing speed in relation to the cobalt layer, and a method for polishing a substrate.

JP 2014229827 discloses an aqueous dispersion for chemical-mechanical polishing containing (A) abrasive grains, (B) an organic acid with 4 or more carbon atoms having $\pi$ electrons, one or more carboxyl groups, and 2 or more groups of at least one group selected from a group consisting of carboxyl group and hydroxyl group, (C) amino acid, (D) an anionic surfactant, and (E) an oxidizer, and has a pH of 6.5 or more and 9.5 or less, capable for polishing of a metal film, such as a cobalt film, at a high polishing rate while suppressing corrosion.

Consequently, it would be highly desirable to have a use of a CMP composition and a CMP process at hand which could avoid all the disadvantages associated with the prior art, for example low material removal rate of Co, high Co corrosion, acidic pH, need for a separate corrosion inhibitor, high concentration of different inhibitors and no tune ability of the polishing performance.

One of the objects of the present invention was to provide the use of a CMP composition appropriate for the chemical mechanical polishing of substrates comprising cobalt and/or a cobalt alloy and showing an improved polishing performance, particularly a low corrosion of cobalt and/or cobalt alloy and a controllable and adjustable material removal rate of cobalt and/or cobalt alloy. Furthermore, the use of a CMP composition was sought that leads to high material removal rates of cobalt and/or cobalt alloy, is compatible with the low k dielectric materials and other metals for example copper of the semiconductor substrates, gives a high quality surface finish, decreases dishing, is storage stable and would be ready-to-use in neutral to alkaline pH range.

Furthermore, a respective CMP process was to be provided.

Accordingly, the use of a chemical mechanical polishing (CMP) composition (Q) for chemical mechanical polishing of a substrate (S) comprising (i) cobalt and/or (ii) a cobalt alloy, wherein the CMP composition (Q) comprises
(A) Inorganic particles
(B) a substituted aromatic compound with at least one carboxylic acid function of the general formula 1 to 5 as corrosion inhibitor

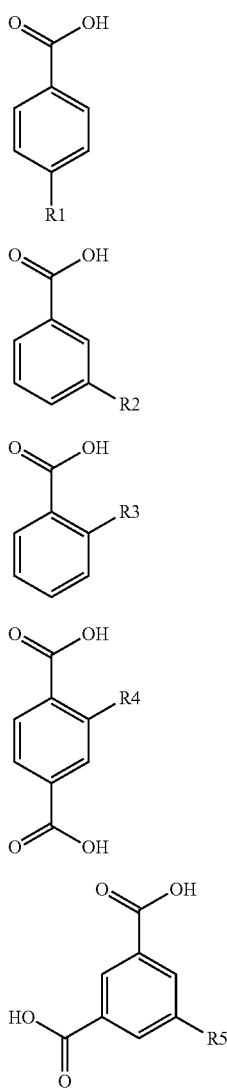

(1)
(2)
(3)
(4)
(5)

wherein $R^1$, $R^2$, $R^3$, $R^4$ and $R^5$ are independently from each other H, hydroxy, alkyl, amino, aryl, alkylamino, alkylarylamino, benzylamino, carboxy, alkylsulfonyl, sulfonic acid, sulfonate, thio or alkylthio (C) at least one amino acid
(D) at least one oxidizer,
(E) an aqueous medium and
wherein the CMP composition (Q) has a pH of from 7 to 10.

According to a further aspect of the invention there is provided a chemical mechanical polishing (CMP) composition comprising
(A colloidal silica particles in a total amount of from 0.01 wt.-% to 3 wt.-% based on the total weight of the respective CMP composition
(B) at least one substituted aromatic compound with at least one carboxylic acid function (B) selected from the group consisting of isophathalic acid, terephthalic acid, 2-amino-terephthalic acid, 4-methylamino benzoic acid, 4-(dimethylamino)benzoic acid, 4-methyl-sulfonyl benzoic acid, trimesic acid, 3-methylamino benzoic acid, 4-(diethylamino)benzoic acid, 3-dimethylamino benzoic acid and 2 (benzylamino)benzoic acid in a total amount of from 0.002 wt.-% to 0.1 wt.-% based on the total weight of the respective CMP composition
(C) at least one amino acids (C) selected from the group consisting of glycine, alanine, leucine, valine, cysteine, serine and proline or a salt thereof, in a total amount of from 0.2 wt.-% to 0.9 wt.-% based on the total weight of the respective CMP composition
(D) hydrogen peroxide in a total amount of from 0.2 wt.-% to 2 wt.-% based on the total weight of the respective CMP composition.
(E) an aqueous medium,
wherein the CMP composition (Q) has a pH of from 7 to 10, which fulfills the objects of the invention.

In addition, the above-mentioned objects of the invention are achieved by a process for the manufacture of a semiconductor device comprising the chemical mechanical polishing of a substrate (S) used in the semiconductor industry wherein the substrate (S) comprises (i) cobalt and/or (ii) a cobalt alloy in the presence of said chemical mechanical polishing (CMP) composition (Q).

Surprisingly, it could be found that the use of a CMP composition (Q) according to the invention is leading to an improved corrosion inhibition on cobalt and/or cobalt alloy comprising substrates combined with a high cobalt material removal rate.

Preferred embodiments are explained in the claims and the specification. It is understood that combinations of preferred embodiments are within the scope of the present invention.

According to the invention, the CMP composition comprises inorganic particles (A).

Generally, the chemical nature of inorganic particles (A) is not particularly limited. (A) may be of the same chemical nature or a mixture of particles of different chemical nature. As a rule, particles (A) of the same chemical nature are preferred.

(A) can be
inorganic particles such as a metal, a metal oxide or carbide, including a metalloid, a metalloid oxide or carbide, or
a mixture of inorganic particles.
Generally, (A) can be
of one type of colloidal inorganic particles,
of one type of fumed inorganic particles,
a mixture of different types of colloidal and/or fumed inorganic particles,
Generally, colloidal inorganic particles are inorganic particles which are produced by a wet precipitation process; fumed inorganic particles are produced by high temperature flame hydrolysis of for example metal chloride precursor with hydrogen in the presence of oxygen, for example using the Aerosil® process.

Preferably, inorganic particles (A) are colloidal or fumed inorganic particles or a mixture thereof. Among them, oxides and carbides of metals or metalloids are preferred. More preferably, particles (A) are alumina, ceria, copper oxide, iron oxide, nickel oxide, manganese oxide, silica, silicon nitride, silicon carbide, tin oxide, titania, titanium carbide, tungsten oxide, yttrium oxide, zirconia, or mixtures or composites thereof. Most preferably, particles (A) are alumina, ceria, silica, titania, zirconia, or mixtures or composites thereof. In particular, (A) are silica particles. For example, (A) are colloidal silica particles.

As used herein, the term "colloidal silica" refers to silicon dioxide that has been prepared by condensation polymerization of Si(OH)4. The precursor Si(OH)4 can be obtained, for example, by hydrolysis of high purity alkoxysilanes, or by acidification of aqueous silicate solutions. Such colloidal silica can be prepared in accordance with U.S. Pat. No. 5,230,833 or can be obtained as any of various commercially available products, such as the Fuso PL-1, PL-2, and PL-3 products, and the Nalco 1050, 2327 and 2329 products, as well as other similar products avail-able from DuPont, Bayer, Applied Research, Nissan Chemical, Nyacol and Clariant.

According to the invention the amount of (A) in the CMP composition (Q) is not more than 3.0 wt. % based on the total weight of the composition (Q). Preferably not more than 2.5 wt. %, most preferably not more than 1.8 wt. %, particularly not more than 1.5 wt. %, based on the total weight of the composition (Q). According to the invention, the amount of (A) is at least 0.0001 wt. %, preferably at least 0.02 wt. %, more preferably at least 0.1 wt. %, most preferably at least 0.2 wt. %, particularly at least 0.3 wt. %, based on the total weight of the composition (Q). For example the amount of (A) can be in the range of from 0.4 wt. % to 1.2 wt. %.

Generally, the particles (A) can be contained in the composition (Q) in various particle size distributions. The particle size distribution of the particles (A) can be monomodal or multimodal. In case of multimodal particle size distribution, bimodal is often preferred. In order to have an easily reproducible property profile and easily reproducible conditions during the CMP process of the invention, a monomodal particle size distribution may be preferred for the particles (A). Often it is most preferred for the particles (A) to have a monomodal particle size distribution.

Generally which particle size distribution the particles (A) may have is not particularly limited.

The mean particle size of the particles (A) can vary within a wide range. The mean particle size is the $d_{50}$ value of the particle size distribution of the particles (A) in the aqueous medium (E) and can be measured for example using dynamic light scattering (DLS) or static light scattering (SLS) methods. These and other methods are well known in the art, see e.g. Kuntzsch, Timo; Witnik, Ulrike; Hollatz, Michael Stintz; Ripperger, Siegfried; Characterization of Slurries Used for Chemical-Mechanical Polishing (CMP) in the Semiconductor Industry; Chem. Eng. Technol; 26 (2003), volume 12, page 1235.

For DLS, typically a Horiba LB-550 V (DLS, dynamic light scattering measurement according to manual) or any other such instrument is used. This technique measures the hydrodynamic diameter of the particles as they scatter a laser light source ($\lambda$=650 nm), detected at an angle of 90° or 173° to the incoming light. Variations in the intensity of the scattered light are due to the random Brownian motion of the particles as they move through the incident beam and are monitored as a function of time. Autocorrelation functions performed by the instrument as a function of delay time are used to extract decay constants; smaller particles move with higher velocity through the incident beam and correspond to faster decays.

These decay constants are proportional to the diffusion coefficient, Dt, of the particle and are used to calculate particle size according to the Stokes-Einstein equation:

$$D_h = \frac{k_B T}{3\pi \eta D_t}$$

where the suspended particles are assumed to (1) have a spherical morphology and (2) be uniformly dispersed (i.e. not agglomerated) throughout the aqueous medium (E). This relationship is expected to hold true for particle dispersions that contain lower than 1% by weight of solids as there are no significant deviations in the viscosity of the aqueous dispersant (E), in which $\eta$=0.96 mPa·s (at T=22° C.). The particle size distribution of the fumed or colloidal inorganic particle dispersion (A) is usually measured in a plastic cuvette at 0.1 to 1.0% solid concentration and dilution, if necessary, is carried out with the dispersion medium or ultra-pure water.

Preferably, the mean particle size of the particles (A) is in the range of from 20 to 200 nm, more preferably in the range of from 25 to 180 nm, most preferably in the range of from 30 to 170 nm, particularly preferably in the range of from 40 to 160 nm, and in particular in the range of from 45 to 150 nm, as measured with dynamic light scattering techniques using instruments for example a High Performance Particle Sizer (HPPS) from Malvern Instruments, Ltd. or Horiba LB550.

The BET surface determined according to DIN ISO 9277:2010-09 of the particles (A) can vary within a wide range. Preferably, the BET surface of the particles (A) is in the range of from 1 to 500 $m^2/g$, more preferably in the range of from 5 to 250 $m^2/g$, most preferably in the range of from 10 to 100 $m^2/g$, in particular in the range of from 20 to 95 $m^2/g$, for example in the range of from 25 to 92 $m^2/g$.

The particles (A) can be of various shapes. Thereby, the particles (A) may be of one or essentially only one type of shape. However, it is also possible that the particles (A) have different shapes. For instance, two types of differently shaped particles (A) may be present. For example, (A) can have the shape of agglomerates, cubes, cubes with bevelled edges, octahedrons, icosahedrons, cocoons, nodules or spheres with or without protrusions or indentations. Preferably, they are essentially spherical, whereby typically these have protrusions or indentations.

It may be prefered that, the inorganic particles (A) are cocoon-shaped. The cocoons may be with or without protrusions or indentations. Cocoon-shaped particles are particles with a minor axis of from 10 to 200 nm, a ratio of major/minor axis of 1.4 to 2.2, more preferably of 1.6 to 2.0. Preferably ably they have an averaged shape factor of from 0.7 to 0.97, more preferably of from 0.77 to 0.92, preferably an averaged sphericity of from 0.4 to 0.9, more preferably of from 0.5 to 0.7 and preferably an averaged equivalent circle diameter of from 41 to 66 nm, more preferably of from 48 to 60 nm, which can be determined by transmission electron microscopy and scanning electron microscopy.

The determination of the shape factor, the sphericity and the equivalent circle diameter of cocoon-shaped particles is explained hereinbelow with reference to FIGS. 1 to 4.

The shape factor gives information on the shape and the indentations of an individual particle (see FIG. 1) and can be calculated according to the following formula:

shape factor=4$\pi$ (area/perimeter$^2$)

The shape factor of a spheric particle without indentations is 1. The value of shape factor decreases when the number of indentations increases.

The sphericity (see FIG. 2) gives information on the elongation of an individual particle using the moment about the mean and can be calculated according to the following formula wherein M are the centres of gravity of the respective particle:

$$\text{sphericity} = (M_{xx} - M_{yy}) - [4M_{xy}^2 + (M_{yy} - M_{xx})^2]^{0.5}/(M_{xx} - M_{yy}) + [4M_{xy}^2 + (M_{yy} - M_{xx})^2]^{0.5}$$

$$\text{elongation} = (1/\text{sphericity})^{0.5}$$

wherein $Mxx = \Sigma(x - x_{mean})^2/N$ $Myy = \Sigma(y - y_{mean})^2/N$ $Mxy = \Sigma[(x - x^{mean})]/N$ N number of pixels forming the image of the respective particle x, y coordinates of the pixels $x_{mean}$ mean value of the x coordinates of the N pixels forming the image of said particle $y_{mean}$ mean value of the y coordinates of the N pixels forming the image of said particle The sphericity of a spheric particle is 1. The value of the sphericity decreases when particles are elongated.

Figure 3:
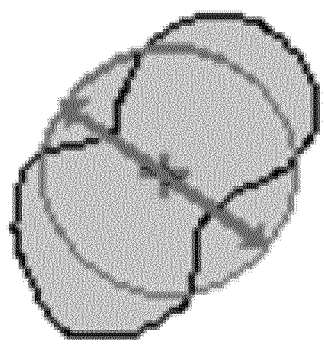

The equivalent circle diameter (also abbreviated as ECD in the following) of an individual non-circular particle gives information on the diameter of a circle which has the same area as the respective non-circular particle (see FIG. 3).

The averaged shape factor, averaged sphericity and averaged ECD are the arithmetic averages of the respective property related to the analyzed number of particles.

The procedure for particle shape characterization is as follows. An aqueous cocoon-shaped silica particle dispersion with 20 wt. % solid content is dispersed on a carbon foil and is dried. The dried dispersion is analyzed by using Energy Filtered-Transmission Electron Microscopy (EF-TEM) (120 kilo volts) and Scanning Electron Microscopy secondary electron image (SEM-SE) (5 kilo volts). The EF-TEM image (see FIG. 4) having a resolution of 2 k, 16 Bit, 0.6851 nm/pixel is used for the analysis. The images are binary coded using the threshold after noise suppression. Afterwards wards the particles are manually separated. Overlying and edge particles are discriminated and not used for the analysis. ECD, shape factor and sphericity as defined before are calculated and statistically classified.

For example, cocoon-shaped particles may be FUSO® PL-3 manufactured by Fuso Chemical Corporation having an average primary particle size (d1) of 35 nm and an average secondary particle size (d2) of 70 nm.

According to the invention, the used CMP composition (Q) comprises a substituted aromatic compound with at least one carboxylic acid function (B) of the general formula 1 to 5 as corrosion inhibitor

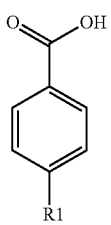

(1)

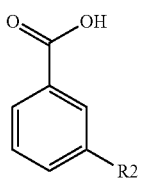

(2)

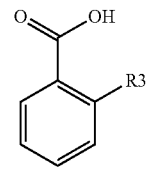

(3)

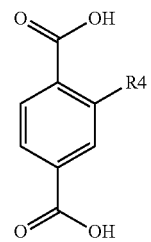

(4)

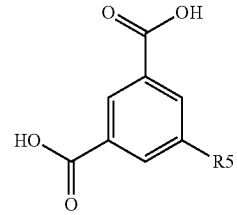

(5)

$R^1$ may preferably be H, hydroxy, alkyl, aryl, amino, alkylamino, alkylarylamino, benzylamino, carboxyl, alkylsulfonyl, sulfonic acid, sulfonate, thio or alkylthio, more preferably $R^1$ may be H, hydroxyl, methyl, ethyl, propyl, butyl, phenyl, benzyl, amino, mono-methylamino, dimethylamino, mono-ethylamino, diethylamino, carboxyl, methylsulfonyl, ethylsulfonyl, thio, methylthio or ethylthio, most preferably $R^1$ may be H, hydroxyl, amino, mono-methylamino, dimethylamino, monoethylamino, diethylamino, carboxyl, methylsulfonyl or ethylsulfonyl, particular preferably $R^1$ may be mono-methylamino, dimethylamino, diethylamino, carboxyl or methylsulfonyl.

$R^2$ may preferably be H, hydroxy, alkyl, aryl, amino, alkylamino, alkylarylamino, benzylamino, carboxyl, alkylsulfonyl, sulfonic acid, sulfonate, thio or alkylthio, more preferably $R^2$ may be H, hydroxyl, methyl, ethyl, propyl, butyl, phenyl, benzyl, amino, mono-methylamino, dimethylamino, mono-ethylamino, diethylamino, carboxyl, methylsulfonyl, ethylsulfonyl, thio, methylthio or ethylthio, most preferably $R^2$ may be amino, mono-methylamino, dimethylamino, mono-ethylamino, diethylamino or carboxyl, particular preferably $R^1$ may be mono-methylamino or dimethylamino.

$R^3$ may preferably be H, hydroxy, alkyl, aryl, amino, alkylamino, alkylarylamino, benzylamino, carboxyl, alkylsulfonyl, sulfonic acid, sulfonate, thio or alkylthio, more preferably $R^3$ may be H, hydroxyl, methyl, ethyl, propyl, butyl, benzylamino, amino, mono-methylamino, dimethylamino, mono-ethylamino, diethylamino, carboxyl, methylsulfonyl, ethylsulfonyl, thio, methylthio or ethylthio, most preferably $R^3$ may be benzylamino, amino, mono-methylamino, dimethylamino, mono-ethylamino, diethylamino or carboxyl, particular preferably $R^3$ may be benzylamino.

$R^4$ may preferably be H, hydroxy, alkyl, aryl, amino, alkylamino, alkylarylamino, benzylamino, carboxyl, alkylsulfonyl, sulfonic acid, sulfonate, thio or alkylthio, more preferably $R^4$ may be H, hydroxyl, methyl, ethyl, propyl, butyl, amino, mono-methylamino, dimethylamino, mono-ethylamino, diethylamino, carboxyl, methylsulfonyl, ethylsulfonyl, thio, methylthio or ethylthio, most preferably $R^4$ may be amino, mono-methylamino, dimethylamino, monoethylamino, diethylamino or carboxyl, particular preferably $R^4$ may be amino or dimethylamino.

$R^5$ may preferably be H, hydroxy, alkyl, aryl, amino, alkylamino, alkylarylamino, benzylamino, carboxyl, alkylsulfonyl, sulfonic acid, sulfonate, thio or alkylthio, more preferably $R^5$ may be H, hydroxyl, methyl, ethyl, propyl, butyl, amino, mono-methylamino, dimethylamino, monoethylamino, diethylamino, carboxyl, methylsulfonyl, ethylsulfonyl, thio, methylthio or ethylthio, most preferably $R^5$ may be amino, mono-methylamino, dimethylamino, monoethylamino, di-ethylamino or carboxyl, particular preferably $R^5$ may be carboxyl.

For example compound (B) of general formula (I) may be isophathalic acid, terephthalic acid, 2-amino-terephthalic acid, 4-methylamino benzoic acid, 4-(dimethylamino)benzoic acid, 4-methyl-sulfonyl benzoic acid, trimesic acid, 3-methylamino benzoic acid, 4-(diethylamino)benzoic acid, 3-dimethylamino benzoic acid or 2 (benzylamino)benzoic acid.

The compound (B) of general formulas 1 to 5 as defined above acts as a corrosion inhibitor for cobalt and/or cobalt alloy alone without the addition of commonly known corrosion inhibitors used in CMP as for example benzotriazol (BTA). It is presently believed that the compound (B) of general formulas 1 to 5 can act as corrosion inhibitor by forming a protective molecular layer on the surface of cobalt and/or cobalt alloy. Surprisingly it has now been found that the compound (B) of the general formulas 1 to 5 in contrast to the known and commonly used compound benzotriazole (BTA) and derivatives of BTA as well as other triazoles used in the prior art for CMP compositions have an advantageous effect in terms of lower etching rate for cobalt and/or cobalt alloy thus a better corrosion inhibition, combined with a higher material removal rate for cobalt and/or cobalt alloy comprising substrates.

According to the invention the amount of (B) in the used CMP composition (Q) is not more than 0.2 wt. % based on the total weight of the composition (Q). Preferably not more than 0.1 wt. %, even more preferably not more than 0.08 wt. %, even more preferably not more than 0.06 wt. %, most preferably not more than 0.01 wt. %, particularly not more than 0.0095 wt. %, based on the total weight of the composition (Q). According to the invention, the amount of (B) is at least 0.002 wt. %, preferably at least 0.0025 wt. %, more preferably at least 0.003 wt. %, even more preferably at least 0.004 wt. %, even more preferably at least 0.005 wt. %, most preferably at least 0.007 wt. %, particularly at least 0.008 wt. %, based on the total weight of the composition (Q). For example the amount of (B) can be in the range of from 0.0022 wt. % to 0.0092 wt. %.

According to the invention, the used CMP composition comprises at least one amino acid (C).

Generally organic compounds that have an amino group and an acid group are referred to as amino acids. For the purposes of this invention, all individual stereoisomers and racemic mixtures thereof are also contemplated for the amino acids. It may be preferred that both the amino and the acid groups are attached to one carbon (termed as alpha-amino carboxylic acids) are used as the chemical additive in the CMP slurry. Many alpha-amino carboxylic acids are known and there are twenty "natural" amino acids which are used as basic components of proteins in living organisms. The amino acids can be hydrophilic, neutral or hydrophobic depending on their side chains in presence of an aqueous carrier. The addition of alpha amino acid as polishing additive may increase the metal material removal rates The at least one alpha-amino acid (C) may be represented by the general formula (II)

$$H_2N-CR^1R^2COOH \qquad (II)$$

wherein $R^1$ and $R^2$ are independently from each other hydrogen, cyclic, branched and straight chain moieties having from 1 to 8 carbon atoms that are unsubstituted or substituted with one or more substituents selected from nitrogen containing substituents, oxygen containing substituents and sulfur containing substituents including but not limited to —COOH, —CONH$_2$, —NH$_2$, —S—, —OH, —SH, and mixtures and salts thereof.

Preferably, the at least one amino acid (C) is alpha-alanine, arginine, aspartic acid, cystine, cysteine, glutamine, glutamic acid, glycine, histidine, isoleucine, leucine, lysine, methionine, phenylalanine, proline, serine, threonine, tryptophan, tyrosine, valine, and mixtures and salts thereof. More preferably (C) is alpha-alanine, arginine, aspartic acid, glutamic acid, glycine, histidine, leucine, lysine, proline, serine, valine, and mixtures and salts thereof. Most preferably (C) is alpha-alanine, aspartic acid, glutamic acid, glycine, proline, serine, and mixtures and salts thereof, particularly (C) is alpha-alanine, aspartic acid, glycine and mixtures and salts thereof, for example (C) is glycine.

According to the invention the amount of the amino acid (C) in the CMP composition (Q) is not more than 2.25 wt. % based on the total weight of the composition (Q). More preferably not more than 1.2 wt. %, most preferably not more than 1 wt. %, particularly not more than 0.8 wt. %, based on the total weight of the composition (Q). According to the invention, the amount of (C) is at least 0.1 wt. % based on the total weight of the composition (Q). Preferably at least 0.3 wt. %, more preferably at least 0.4 wt. %, most preferably at least 0.5 wt. %, particularly at least 0.6 wt. %, based on the total weight of the composition (Q). For example the amount of (C) can be in the range of from 0.65 wt. % to 0.78 wt. %.

The CMP composition used according to the present invention comprises at least one oxidizer (D), preferably one to two types of oxidizers (D), more preferably one type of oxidizer (D). The oxidizer (D) is different from the components (A), (B), (C) and (E). In general, an oxidizer is a compound which is capable of oxidizing the to-be-polished substrate or one of its layers. Preferably, (D) is a per-type oxidizer. More preferably, (D) is a peroxide, persulfate, perchlorate, perbromate, periodate, permanganate, or a derivative thereof. Most preferably, (D) is a peroxide or persulfate. Particularly, (D) is a peroxide. For example, (D) is hydrogen peroxide.

The at least one oxidizer (D) can be contained in varying amounts in the CMP composition used according to the present invention. Preferably, the amount of (D) is not more than 4 wt. % (wt. % in each case stands for "percent by weight"), more preferably not more than 2.5 wt. %, most preferably not more than 1.8 wt. %, particularly not more than 1.5 wt. %, for example not more than 1.2 wt. %, in each case based on the total weight of the CMP composition used according to the present invention. Preferably, the amount of (D) is at least 0.2 wt. %, more preferably at least 0.25 wt. %, most preferably at least 0.3 wt. %, particularly at least 0.35 wt. %, for example at least 0.4 wt. %, in each case based on the total weight of the composition used according to the present invention. If hydrogen peroxide is used as oxidizer (D), the amount of (D) is preferably 0.2 wt. % to 2.8 wt. %, more preferably 0.28 wt. % to 1.9 wt. %, for instance 1.0 wt.

%, in each case based on the total weight of the CMP composition used according to the present invention According to the invention the used CMP composition comprises an aqueous medium (E). (E) can be of one type or a mixture of different types of aqueous media.

In general, the aqueous medium (E) can be any medium which contains water. Preferably, the aqueous medium (E) is a mixture of water and an organic solvent miscible with water (e.g. an alcohol, preferably a $C_1$ to $C_3$ alcohol, or an alkylene glycol derivative). More preferably, the aqueous medium (E) is water. Most preferably, the aqueous medium (E) is de-ionized water.

If the amounts of the components other than (E) are in total x % by weight of the CMP composition, then the amount of (E) is (100−x) % by weight of the CMP composition (Q).

The properties of the CMP composition used according to the invention respectively, such as stability, polishing performance and etching behavior of the composition as against different materials, for example metals vs. silicon dioxide, may depend on the pH of the corresponding composition.

According to the invention the used CMP composition (Q) has a pH in the range of from 7 to 10. Preferably, the pH value of the compositions used according to the invention respectively is in the range of from 7.2 to 9.4, more preferably from 7.5 to 9.0, most preferably from 7.7 to 8.8, particularly preferably from 7.8 to 8.6, for example from 7.9 to 8.4.

The used CMP composition of the invention can further optionally contain at least one additional complexing agent (G) different from the at least one amino acid (C), for example one complexing agent. In general, the complexing agent is a compound which is capable of complexing the ions of the to-be-polished substrate or of one of its layers. Preferably, (G) is a carboxylic acid having at least one COOH groups, an N-containing carboxylic acid, N-containing sulfonic acid, N-containing sulfuric acid, N-containing phosphonic acid, N-containing phosphoric acid, or a salt thereof. More preferably, (G) is a carboxylic acid having at least two COOH groups, an N-containing carboxylic acid, or a salt thereof. For example the at least one additional complexing agent (G) can be acetic acid, gluconic acid, lactic acid, nitriloacetic acid, ethylenediaminetetraacetic acid (EDTA), imino-di-succinic acid, glutaric acid, citric acid, malonic acid, 1,2,3,4-butanetetracarboxylic acid, fumaric acid, tartaric acid, succinic acid and phytic acid.

If present, the complexing agent (G) can be contained in varying amounts. Preferably, the amount of (G) is not more than 20 wt. %, more preferably not more than 10 wt. %, most preferably not more than 5 wt. %, for example not more than 2 wt. %, based on the total weight of the corresponding composition. Preferably, the amount of (G) is at least 0.05 wt. %, more preferably at least 0.1 wt. %, most preferably at least 0.5 wt. %, for example at least 1 wt. %, based on the total weight of the corresponding composition.

The used CMP composition of the invention can further optionally contain at least one biocide (H), for example one biocide. In general, the biocide is a compound which deters, renders harmless, or exerts a controlling effect on any harmful organism by chemical or biological means. Preferably, (H) is an quaternary ammonium compound, an isothiazolinone-based compound, an N-substituted diazenium dioxide, or an N'-hydroxy-diazenium oxide salt. More preferably, (H) is an N-substituted diazenium dioxide, or an N'-hydroxy-diazenium oxide salt.

If present, the biocide (H) can be contained in varying amounts. If present, the amount of (H) is preferably not more than 0.5 wt. %, more preferably not more than 0.1 wt. %, most preferably not more than 0.05 wt. %, particularly not more than 0.02 wt. %, for example not more than 0.008 wt. %, based on the total weight of the corresponding composition. If present, the amount of (H) is preferably at least 0.0001 wt. %, more preferably at least 0.0005 wt. %, most preferably at least 0.001 wt. %, particularly at least 0.003 wt. %, for example at least 0.006 wt. %, based on the total weight of the corresponding composition.

The CMP compositions used according to the invention respectively may also contain, if necessary depending on the specific requirements of the intended use of said CMP composition, various other additives, including but not limited to pH adjusting agents, buffer substances, stabilizers, surfactants which may be anionic surfactants, non-ionic surfactants or cationic-surfactants, friction reducing agents etc. Said other additives are for instance those commonly employed in CMP compositions and thus known to the person skilled in the art. Such addition can for example stabilize the dispersion, or improve the polishing performance, or the selectivity between different layers.

If present, said additive can be contained in varying amounts. Preferably, the amount of said additive is not more than 10 wt. %, more preferably not more than 1 wt. %, most preferably not more than 0.1 wt. %, for example not more than 0.01 wt. %, based on the total weight of the corresponding composition. Preferably, the amount of said additive is at least 0.0001 wt. %, more preferably at least 0.001 wt. %, most preferably at least 0.01 wt. %, for example at least 0.1 wt. %, based on the total weight of the corresponding composition.

The CMP composition (Q) used according to the invention is for chemical-mechanical polishing of a substrate (S) used in the semiconductor industry comprising cobalt and/or a cobalt alloy.

The cobalt and/or cobalt alloy can be of any type, form, or shape. The cobalt and/or cobalt alloy preferably has the shape of a layer and/or overgrowth. If this cobalt and/or cobalt alloy has the shape of a layer and/or overgrowth, the cobalt and/or cobalt alloy content is preferably more than 90%, more preferably more than 95%, most preferably more than 98%, particularly more than 99%, for example more than 99.9% by weight of the corresponding layer and/or overgrowth. The cobalt and/or cobalt alloy has been preferably filled or grown in trenches or plugs between other substrates, more preferably filled or grown in trenches or plugs in dielectric materials like for example $SiO_2$, silicon, low-k (BD1, BD2) or ultra low-k materials, or other isolating and semiconducting material used in the semiconductor industry. For example in the Through Silicon Vias (TSV) middle process insolated materials such as polymers, photoresist and/or polyimide can be used as insulating material between the subsequent processing steps of wet etch and CMP for insulating/isolating properties after revealing the TSV from the backside of the wafer. Between the copper comprising and the dielectric material can be a thin layer of a barrier material. Generally barrier materials to prevent metal ions from diffusing into the dielectric material can for example be Ti/TiN, Ta/TaN or Ru or Ru-alloys, Co or Co-alloys.

If the CMP composition (Q) according to the invention is used for polishing a substrate comprising cobalt and/or cobalt alloy the static etch rate (SER) of cobalt is preferably below 100 Å/min, more preferably below 80 Å/min, most preferably below 70 Å/min, in particular preferably below 60 Å/min, for example the static etch rate may be below 38 Å/min.

If the CMP composition (Q) according to the invention is used for polishing a substrate comprising cobalt and/or cobalt alloy the material removal rate (MRR) of cobalt is preferably in the range of from 400 to 7500 Å/min, more preferably in the range of from 850 to 6500 Å/min, most preferably in the range of from 920 to 5800 Å/min, in particular preferably in the range of from 980 to 5500 Å/min, for example the cobalt material removal rate is in the range of from 1000 to 5650 Å/min.

A semiconductor device can be manufactured by a process which comprises the chemical mechanical polishing of a substrate (S) used in the semiconductor industry in the presence of the CMP composition (Q) of the invention. According to the invention said process comprises the chemical mechanical polishing of a substrate (S) comprising cobalt and/or cobalt alloy.

Generally, the semiconductor device which can be manufactured by the process according to the invention is not particularly limited. Thus the semiconductor devices can be an electronic component comprising semiconducting materials, as for example silicon, germanium, and III-V materials. Semiconductor devices can be those which are manufactured as single discrete devices or those which are manufactured as integrated circuits (ICs) consisting of a number of devices manufactured and interconnected on a wafer. Semiconductor devices can be two terminal devices for example a diode, three terminal devices for example a bipolar transistor, four terminal devices for example a Hall effect sensor or multi-terminal devices. Preferably, said semiconductor device is a multi-terminal device. Multi-terminal devices can be logic devices as integrated circuits and microprocessors or memory devices as random access memory (RAM), read only memory (ROM) and phase change random access memory (PCRAM). Preferably said semiconductor device is a multi-terminal logic device. In particular said semiconductor device is an integrated circuit or microprocessor.

Generally, in integrated circuits Co is used as adhesion or barrier layer for copper interconnects. In its nano-crystalline form Co is contained for example in memory devices and as metal gate in MOSFET. Cobalt can also be used as a seed to enable plating of copper by electro-deposition. Cobalt or a cobalt alloy can also be used as wiring instead of copper for one or more layers. For example a capacitor (CAP) can be formed by successive layers of metal, insulator, metal (MIM) and a thin film resistor at the same level. Circuit designers can now wire to the TaN thin film resistor at the lowest metal level, which reduces parasitics and allows more efficient usage of the existing wiring levels. The excess copper and/or cobalt and the adhesion/barrier layer comprising Co in form of, for example metal nitrides or metal carbon nitrides, such as Co/TaN, Co/TiN, Co/TaCN, Co/TiCN, or for example as a single cobalt alloy layer, such as CoMo, CoTa, CoTi and CoW above the dielectrics, can be removed by the chemical mechanical polishing process according to the invention.

Generally, this cobalt and/or cobalt alloy can be produced or obtained in different ways. Cobalt or cobalt alloys can be produced by ALD, PVD or CVD processes. It is possible that cobalt or the cobalt alloy is deposited onto a barrier material. Proper materials for barrier application are well known in the arts. The barrier prevents metal atoms or ions like cobalt or copper from diffusing into the dielectric layer and improves the adhesion properties of the conductive layer. Ta/TaN, Ti/TiN can be used.

Generally, this cobalt and/or cobalt alloy can be of any type, form, or shape. This cobalt and/or cobalt alloy preferably has the shape of a layer and/or overgrowth. If this cobalt and/or cobalt alloy has the shape of a layer and/or overgrowth, the cobalt and/or cobalt alloy content is preferably more than 90%, more preferably more than 95%, most preferably more than 98%, particularly more than 99%, for example more than 99.9% by weight of the corresponding layer and/or overgrowth. This cobalt and/or cobalt alloy has been preferably filled or grown in trenches or plugs between other substrates, more preferably filled or grown in trenches or plugs in dielectric materials like for example SiO2, silicon, low-k (BD1, BD2) or ultra low-k materials, or other isolating and semiconducting material used in the semiconductor industry.

Generally, the down pressure or down force is a downward pressure or a downward force which is applied by the carrier to the wafer pressing it against the pad during CMP. This down pressure or down force can for example be measured in pound per square inch (abbreviated as psi)

For example the process of the invention may be performed with a down pressure of 2 psi or lower. Preferably the down pressure is in the range of from 0.1 to 1.9 psi, more preferably in the range of from 0.3 to 1.8 psi, most preferably in the range of from 0.4 to 1.7 psi, particularly preferable in the range of from 0.8 to 1.6 psi, for example 1.3 psi.

If the process of the invention comprises the chemical mechanical polishing of a substrate comprising cobalt and/or a cobalt alloy the static etch rate (SER) of cobalt is preferably below 100 Å/min, more preferably below 80 Å/min, most preferably below 70 Å/min, in particular preferably below 60 Å/min, for example the static etch rate may be below 38 Å/min.

If the process of the invention comprises the chemical mechanical polishing of a substrate comprising cobalt and/or a cobalt alloy the material removal rate (MRR) of cobalt is preferably in the range of from 300 to 7500 Å/min, more preferably in the range of from 850 to 6500 Å/min, most preferably in the range of from 920 to 5800 Å/min, in particular preferably in the range of from 980 to 5500 Å/min, for example the cobalt material removal rate is in the range of from 1000 to 5650 Å/min.

These different ranges of cobalt material removal rates can be reached for example by varying the concentration of component (B) and the concentration of the abrasive (A) of the CMP composition (Q).

Examples of CMP Compositions (Q) Used According to the Invention

Z1:
- (A) colloidal silica particles in a total amount of from 0.01 wt.-% to 1.8 wt.-% based on the total weight of the respective CMP composition
- (B) is isophathalic acid in a total amount of from 0.002 wt.-% to 0.0097 wt.-% based on the total weight of the respective CMP composition
- (C) at least one amino acids (C) selected from the group consisting of glycine, alanine, leucine, valine, cysteine, serine and proline or a salt thereof, in a total amount of from 0.35 wt.-% to 0.8 wt.-% based on the total weight of the respective CMP composition
- (D) hydrogen peroxide in a total amount of from 0.2 wt.-% to 1.5 wt.-% based on the total weight of the respective CMP composition.
- (E) an aqueous medium,
  wherein the CMP composition (Q) has a pH of from 7.8 to 8.9.

Z2:
- (A) colloidal silica particles in a total amount of from 0.01 wt.-% to 1.8 wt.-% based on the total weight of the respective CMP composition
- (B) is terephthalic acid in a total amount of from 0.002 wt.-% to 0.0097 wt.-% based on the total weight of the respective CMP composition
- (C) at least one amino acids (C) selected from the group consisting of glycine, alanine, leucine, valine, cysteine, serine and proline or a salt thereof, in a total amount of from 0.35 wt.-% to 0.8 wt.-% based on the total weight of the respective CMP composition
- (D) hydrogen peroxide in a total amount of from 0.2 wt.-% to 1.5 wt.-% based on the total weight of the respective CMP composition.
- (E) an aqueous medium,
wherein the CMP composition (Q) has a pH of from 7.8 to 8.9.

Z3:
- (A) colloidal silica particles in a total amount of from 0.01 wt.-% to 1.8 wt.-% based on the total weight of the respective CMP composition
- (B) is 2-aminoterephthalic acid in a total amount of from 0.008 wt.-% to 0.08 wt.-% based on the total weight of the respective CMP composition
- (C) at least one amino acids (C) selected from the group consisting of glycine, alanine, leucine, valine, cysteine, serine and proline or a salt thereof, in a total amount of from 0.35 wt.-% to 0.8 wt.-% based on the total weight of the respective CMP composition sition
- (D) hydrogen peroxide in a total amount of from 0.2 wt.-% to 1.5 wt.-% based on the total weight of the respective CMP composition.
- (E) an aqueous medium,
wherein the CMP composition (Q) has a pH of from 7.8 to 8.9.

Z4:
- (A) colloidal silica particles in a total amount of from 0.01 wt.-% to 1.8 wt.-% based on the total weight of the respective CMP composition
- (B) is 4-methylamino benzoic acid in a total amount of from 0.008 wt.-% to 0.08 wt.-% based on the total weight of the respective CMP composition
- (C) at least one amino acids (C) selected from the group consisting of glycine, alanine, leucine, valine, cysteine, serine and proline or a salt thereof, in a total amount of from 0.35 wt.-% to 0.8 wt.-% based on the total weight of the respective CMP composition
- (D) hydrogen peroxide in a total amount of from 0.2 wt.-% to 1.5 wt.-% based on the total weight of the respective CMP composition.
- (E) an aqueous medium,
wherein the CMP composition (Q) has a pH of from 7.8 to 8.9.

Z5:
- (A) colloidal silica particles in a total amount of from 0.01 wt.-% to 1.8 wt.-% based on the total weight of the respective CMP composition
- (B) is 4-(dimethylamino)benzoic acid in a total amount of from 0.008 wt.-% to 0.08 wt.-% based on the total weight of the respective CMP composition
- (C) at least one amino acids (C) selected from the group consisting of glycine, alanine, leucine, valine, cysteine, serine and proline or a salt thereof, in a total amount of from 0.35 wt.-% to 0.8 wt.-% based on the total weight of the respective CMP composition
- (D) hydrogen peroxide in a total amount of from 0.2 wt.-% to 1.5 wt.-% based on the total weight of the respective CMP composition.
- (E) an aqueous medium,
wherein the CMP composition (Q) has a pH of from 7.8 to 8.9.

Z6:
- (A) colloidal silica particles in a total amount of from 0.01 wt.-% to 1.8 wt.-% based on the total weight of the respective CMP composition
- (B) is 4-methylsulfonyl benzoic acid in a total amount of from 0.008 wt.-% to 0.08 wt.-% based on the total weight of the respective CMP composition
- (C) at least one amino acids (C) selected from the group consisting of glycine, alanine, leucine, valine, cysteine, serine and proline or a salt thereof, in a total amount of from 0.35 wt.-% to 0.8 wt.-% based on the total weight of the respective CMP composition
- (D) hydrogen peroxide in a total amount of from 0.2 wt.-% to 1.5 wt.-% based on the total weight of the respective CMP composition.
- (E) an aqueous medium,
wherein the CMP composition (Q) has a pH of from 7.8 to 8.9.

Z7:
- (A) colloidal silica particles in a total amount of from 0.01 wt.-% to 1.8 wt.-% based on the total weight of the respective CMP composition
- (B) is trimesic acid in a total amount of from 0.002 wt.-% to 0.0097 wt.-% based on the to tal weight of the respective CMP composition
- (C) at least one amino acids (C) selected from the group consisting of glycine, alanine, leucine, valine, cysteine, serine and proline or a salt thereof, in a total amount of from 0.35 wt.-% to 0.8 wt.-% based on the total weight of the respective CMP composition
- (D) hydrogen peroxide in a total amount of from 0.2 wt.-% to 1.5 wt.-% based on the total weight of the respective CMP composition.
- (E) an aqueous medium,
wherein the CMP composition (Q) has a pH of from 7.8 to 8.9.

Z8:
- (A) colloidal silica particles in a total amount of from 0.01 wt.-% to 1.8 wt.-% based on the total weight of the respective CMP composition
- (B) is 3-methylamino benzoic acid in a total amount of from 0.008 wt.-% to 0.08 wt.-% based on the total weight of the respective CMP composition
- (C) at least one amino acids (C) selected from the group consisting of glycine, alanine, leucine, valine, cysteine, serine and proline or a salt thereof, in a total amount of from 0.35 wt.-% to 0.8 wt.-% based on the total weight of the respective CMP composition
- (D) hydrogen peroxide in a total amount of from 0.2 wt.-% to 1.5 wt.-% based on the total weight of the respective CMP composition.
- (E) an aqueous medium,
wherein the CMP composition (Q) has a pH of from 7.8 to 8.9.

Z9:
- (A) colloidal silica particles in a total amount of from 0.01 wt.-% to 1.8 wt.-% based on the total weight of the respective CMP composition
- (B) is 4-(diethylamino)benzoic acid in a total amount of from 0.008 wt.-% to 0.08 wt.-% based on the total weight of the respective CMP composition (C) at least one amino acids (C) selected from the group consisting of glycine, alanine, leucine, valine, cysteine, serine and proline or a salt thereof, in a total amount of from 0.35 wt.-% to 0.8 wt.-% based on the total weight of the respective CMP composition (D) hydrogen peroxide in a total amount of from 0.2 wt.-% to 1.5 wt.-% based on the total weight of the respective CMP composition.

(E) an aqueous medium, wherein the CMP composition (Q) has a pH of from 7.8 to 8.9.

Z10:
- (A) colloidal silica particles in a total amount of from 0.01 wt.-% to 1.8 wt.-% based on the total weight of the respective CMP composition
- (B) is 3-dimethylamino benzoic acid in a total amount of from 0.008 wt.-% to 0.08 wt.-% based on the total weight of the respective CMP composition
- (C) at least one amino acids (C) selected from the group consisting of glycine, alanine, leucine, valine, cysteine, serine and proline or a salt thereof, in a total amount of from 0.35 wt.-% to 0.8 wt.-% based on the total weight of the respective CMP composition
- (D) hydrogen peroxide in a total amount of from 0.2 wt.-% to 1.5 wt.-% based on the total weight of the respective CMP composition.
- (E) an aqueous medium,
- wherein the CMP composition (Q) has a pH of from 7.8 to 8.9.

Z11:
- (A) colloidal silica particles in a total amount of from 0.01 wt.-% to 1.8 wt.-% based on the total weight of the respective CMP composition
- (B) is 2-(benzylamino)benzoic acid in a total amount of from 0.008 wt.-% to 0.08 wt.-% based on the total weight of the respective CMP composition
- (C) at least one amino acids (C) selected from the group consisting of glycine, alanine, leucine, valine, cysteine, serine and proline or a salt thereof, in a total amount of from 0.35 wt.-% to 0.8 wt.-% based on the total weight of the respective CMP composition
- (D) hydrogen peroxide in a total amount of from 0.2 wt.-% to 1.5 wt.-% based on the total weight of the respective CMP composition.
- (E) an aqueous medium,
- wherein the CMP composition (Q) has a pH of from 7.8 to 8.9.

Processes for preparing CMP compositions are generally known. These processes may be applied to the preparation of the CMP composition used according to the invention. This can be carried out by dispersing or dissolving the above-described components (A), (B), (C), (D) and optional components in the aqueous medium (E), preferably water, and optionally by adjusting the pH value through adding an acid, a base, a buffer or a pH adjusting agent. For this purpose the customary and standard mixing processes and mixing apparatuses such as agitated vessels, high shear impellers, ultrasonic mixers, homogenizer nozzles or counterflow mixers, can be used.

The polishing process is generally known and can be carried out with the processes and the equipment under the conditions customarily used for the CMP in the fabrication of wafers with integrated circuits. There is no restriction on the equipment with which the polishing process can be carried out.

As is known in the art, typical equipment for the CMP process consists of a rotating platen which is covered with a polishing pad. Also orbital polishers have been used. The wafer is mounted on a carrier or chuck. The side of the wafer being processed is facing the polishing pad (single side polishing process). A retaining ring secures the wafer in the horizontal position.

Below the carrier, the larger diameter platen is also generally horizontally positioned and presents a surface parallel to that of the wafer to be polished. The polishing pad on the platen contacts the wafer surface during the planarization process.

To produce material loss, the wafer is pressed onto the polishing pad. Both the carrier and the platen are usually caused to rotate around their respective shafts extending perpendicular from the carrier and the platen. The rotating carrier shaft may remain fixed in position relative to the rotating platen or may oscillate horizontally relative to the platen. The direction of rotation of the carrier is typically, though not necessarily, the same as that of the platen. The speeds of rotation for the carrier and the platen are generally, though not necessarily, set at different values. During the CMP process of the invention the CMP composition of the invention is usually applied onto the polishing pad as a continuous stream or in dropwise fashion. Customarily, the temperature of the platen is set at temperatures of from 10 to 70° C.

The load on the wafer can be applied by a flat plate made of steel for example, covered with a soft pad that is often called backing film. If more advanced equipment is being used a flexible membrane that is loaded with air or nitrogen pressure presses the wafer onto the pad. Such a membrane carrier is preferred for low down force processes when a hard polishing pad is used, because the down pressure distribution on the wafer is more uniform compared to that of a carrier with a hard platen design. Carriers with the option to control the pressure distribution on the wafer may also be used according to the invention. They are usually designed with a number of different chambers that can be loaded to a certain degree independently from each other.

Figure 2:
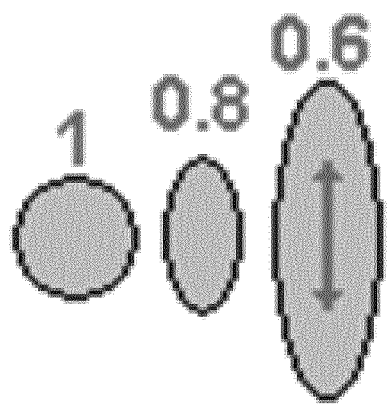

For further details reference is made to WO 2004/063301 A1, in particular page 16, paragraph [0036] to page 18, paragraph [0040] in conjunction with the FIG. 2.

By way of the CMP process of the invention and/or using the CMP composition of the invention, wafers with integrated circuits comprising cobalt and/or cobalt alloy can be obtained which have an excellent functionality.

The CMP composition used according to the invention can be used in the CMP process as ready-to-use slurry, they have a long shelf-life and show a stable particle size distribution over long time. Thus, they are easy to handle and to store. They show an excellent polishing performance, particularly a low static etch rate of cobalt and/or cobalt alloy combined with a high material removal rate (MRR) of cobalt. Since the amounts of its components are held down to a minimum, the CMP composition used according to the invention respectively can be used in a cost-effective way.

The figures show:

FIG. 1: Schematic illustration of the variation of the shape factor with the shape of a particle FIG. 2: Schematic illustration of the variation of the sphericity with the elongation of a particle FIG. 3: Schematic illustration of the Equivalent Circle Diameter (ECD)

Figure 4:
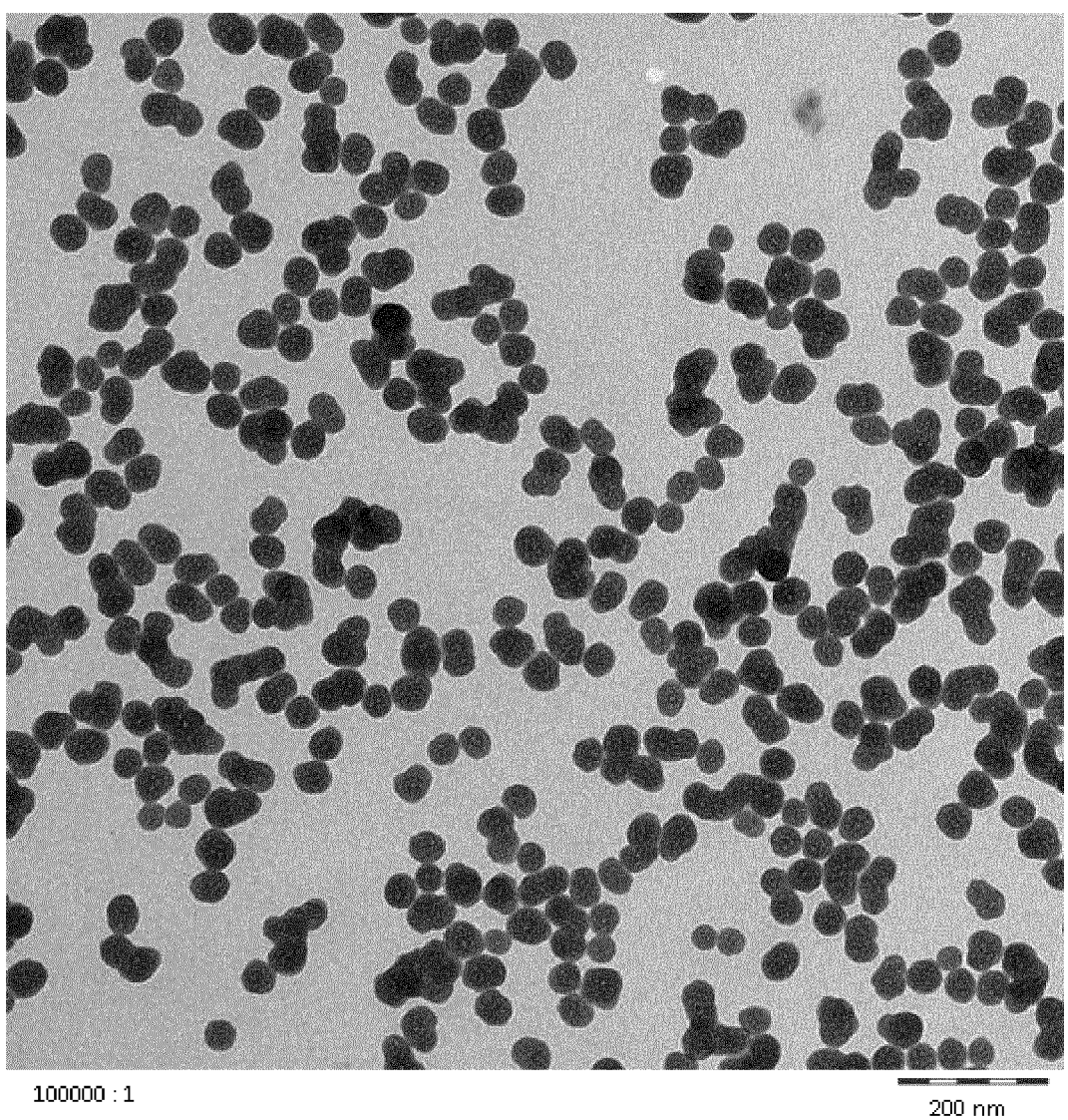

FIG. 4: Energy Filtered-Transmission Electron Microscopy (EF-TEM) (120 kilo volts) image of a dried cocoon-shaped silica particle dispersion with 20 wt. % solid content on a carbon foil

EXAMPLES AND COMPARATIVE EXAMPLES

The general procedure for the CMP experiments is described below.

Standard CMP process for 200 mm Co/Co wafers:
Strasbaugh nSpire (Model 6EC), ViPRR floating retaining ring Carrier;
down pressure: 1.5 psi;
back side pressure: 1.0 psi;
retaining ring pressure: 1.0 psi;
polishing table/carrier speed: 130/127 rpm;
slurry flow rate: 300 ml/min;
polishing time: 15 s; (Co)
60 s; (Cu)
polishing pad: Fujibo H800;
backing film: Strasbaugh, DF200 (136 holes);
conditioning tool: Strasbaugh, soft brush, ex-situ; after each wafer the pad is conditioned for the next processing of an other wafer by 2 sweeps with 51 bs down force. The brush is soft. This means even after 200 sweeps the brush will not have caused a significant removal rate on the soft polishing pad.

Three dummy TEOS wafers are polished with 60 s before the metal wafers are polished (Co wafer is polished for 15 s).

The slurry is stirred in the local supply station.

Standard analysis procedure for metal blanket wafers:
Removal rate is determined by difference of weight of the wafers pre and post CMP by a Sartorius LA310 S scale or a NAPSON 4-point probe station.

The radial uniformity of removal rate is assessed by 39 point diameter scan (range) using NAPSON 4-point probe station.

Standard consumables for CMP of metal film coated wafers:

Co films: 2000 A PVD Co on Ti liner (Supplier: AMT);
The pH-value is measured with a pH combination electrode (Schott, blue line 22 pH electrode).

Standard procedure for determination of the Co static etch rate (Co-SER):

Co-SER experiments were carried on as the following. 2.5×2.5 cm PVD Co (from AMT) were cut and washed with DI water. Co film thickness (dbefore) was measured with a 4-point probe. 400 ml of fresh prepared slurry with 0.5% H2O2 was put in a beaker and brought to 50° C. afterwards. Co coupon was placed into the slurry and kept in the slurry for 3 min. Then the coupon was washed and dried with N2. The Co film thickness (dafter) was measured with the same device again. The Co-SER was determined by the following formula:

SER (A/min)=(dbefore−dafter)/3

Standard procedure for slurry preparation:
An aqueous solution of glycine 10 wt. % is prepared by dissolving the desired amount of glycine in ultra-pure water. After stirring for 20 min the solution is neutralized and the pH is adjusted to pH 8.05±0.1 by adding an 4.8 wt. % aqueous solution of KOH. Balance water may be added to adjust concentration. An aqueous stock solution of the respective substituted aromatic compound (B) 1 wt. % is prepared by dissolving the desired amount of substituted aromatic compound (B) in ultra-pure water and stirring for 30 minutes until all of the solid of the substituted aromatic compound is dissolved.

To prepare the CMP slurry of the examples the glycine (amino acid (C)) solution, the substituted aromatic compound (corrosion inhibitor (B)) solution are mixed and a solution of colloidal silica particles (20% stock solution of (A) for example Fuso® PL 3) is added under continuous stirring. After the complete addition of the desired amount of abrasive (A) the dispersion is stirred for additional 5 minutes. Then the pH is adjusted to 8.3±0.1 by adding an 4.8 wt. % aqueous solution of KOH. Balance water is added under stirring to adjust the concentration of the CMP slurry to the values listed in the tables 2 and table 3 of the examples and comparative examples below. Thereafter the dispersion is filtered by passing through a 0.2 μm filter at room temperature. The desired amount of $H_2O_2$ (D) is added right before (1 to 15 min) before the slurry is used for CMP.

Inorganic Particles (A) Used in the Examples

Colloidal cocoon-shaped Silica particles (A1) having an average primary particle size (d1) of 35 nm and an average secondary particle size (d2) of 70 nm (as determined using dynamic light scattering techniques via a Horiba instrument) (for example Fuso® PL-3) and a specific surface area of around 46 $m^2/g$ were used.

TABLE 1

Experimental results of particle shape analysis of cocoon-shaped silica particles (A)

| statistical function unit | ECD nm | shericity | shape factor |
| --- | --- | --- | --- |
| number of particles | 475 | 475 | 475 |
| average | 53.67 | 0.631 | 0.881 |
| minimum | 33.68 | 0.150 | 0.513 |
| maximum | 99.78 | 0.997 | 0.978 |
| standard deviation | 11.69 | 0.199 | 0.083 |
| median d50 | 51.32 | 0.662 | 0.911 |
| d90 | | | 0.955 |

Procedure for Particle Shape Characterization

An aqueous cocoon-shaped silica particle dispersion with 20 wt. % solid content was dispersed on a carbon foil and was dried. The dried dispersion was analyzed by using Energy Filtered-Transmission Electron Microscopy (EF-TEM) (120 kilo volts) and Scanning Electron Microscopy secondary electron image (SEM-SE) (5 kilo volts). The EF-TEM image with a resolution of 2 k, 16 Bit, 0.6851 nm/pixel (FIG. 4) was used for the analysis. The images were binary coded using the threshold after noise suppression. Afterwards the particles were manually separated. Overlying and edge particles were discriminated and not used for the analysis. ECD, shape factor and sphericity as defined before were calculated and statistically classified.

A2 are agglomerated particles with a specific surface area of around 90 $m^2/g$ having an average primary particle size (d1) of 35 nm and an average secondary particle size (d2) of 75 nm (as determined using dynamic light scattering techniques via a Horiba instrument) (for example Fuso® PL-3H) were used.

TABLE 2

CMP compositions of the examples 1 to 4 and 16 to 27 and of the comparative examples V1 to V4, their pH values, pH variations, concentration variations, Co-SER data as well as their Co-MRR data in the process of chemical-mechanical polishing of 200 mm Co wafers using these compositions, wherein the aqueous medium (E) of the CMP compositions is de-ionized water. The amounts of the components (A), (B), (C) and (D) are specified in weight percent (wt. %) by weight of the corresponding CMP composition. If the amounts of the components other than (E) are in total y % by weight of the CMP composition, then the amount of (E) is (100 − y) % by weight of the CMP composition.

| | Comparative Example V1 | Example 1 | Example 2 | Comparative Example V2 |
|---|---|---|---|---|
| Particles (A) | A1 0.5 wt. % | A1 0.5 wt. % | A1 0.5 wt. % | A1 0.5 wt. % |
| $H_2O_2$ (D) | $H_2O_2$ 1 wt. % | $H_2O_2$ 0.5 wt. % | $H_2O_2$ 0.5 wt. % | $H_2O_2$ 1 wt. % |
| Compound (B) | BTA (Benzotriazole) 0.03 wt % | Isophthalic acid 0.0025 wt % | Terephthalic acid 0.0025 wt % | Isophthalic acid 0.5 wt % |
| Glycine (C) | 0.75 wt. % | 0.75 wt. % | 0.75 wt. % | 0.75 wt. % |
| pH | 8.3 | 8.3 | 8.3 | 8.3 |
| Co-MRR [Å/min] | 718 | 6500 | 6204 | 222 |
| Co-SER [Å/min] | 654 | 37 | 32 | 47 |

| | Example 3 | Example 4 | Comparative Example V3 | Comparative Example V4 |
|---|---|---|---|---|
| Particles (A) | A1 0.5 wt. % | A1 0.5 wt. % | A1 0.5 wt. % | A1 0.5 wt. % |
| $H_2O_2$ (D) | $H_2O_2$ 1 wt. % | $H_2O_2$ 1 wt. % | $H_2O_2$ 1 wt. % | $H_2O_2$ 1 wt. % |
| Compound (B) | Isophthalic acid 0.01 wt % | Isophthalic acid 0.01 wt % | Isophthalic acid 0.01 wt % | Terephthalic acid 0.5 wt % |
| Glycine (C) | 2.25 wt. % | 1.5 wt. % | 3 wt. % | 0.75 wt. % |
| pH | 8.3 | 8.3 | 8.3 | 8.3 |
| Co-MRR [Å/min] | 7133 | 3728 | 8424 | 334 |
| Co-SER [Å/min] | 19 | 71 | 90 | 38 |

| | Example 16 | Example 17 | Example 18 | Example 19 |
|---|---|---|---|---|
| Particles (A) | A1 0.5 wt. % | A1 0.5 wt. % | A1 0.5 wt. % | A1 0.5 wt. % |
| $H_2O_2$ (D) | $H_2O_2$ 1 wt. % | $H_2O_2$ 1 wt. % | $H_2O_2$ 1 wt. % | $H_2O_2$ 1 wt. % |
| Compound (B) | Isophthalic acid 0.0025 wt % | Isophthalic acid 0.005 wt % | Isophthalic acid 0.007 wt % | Isophthalic acid 0.009 wt % |
| Glycine (C) | 0.75 wt. % | 0.75 wt. % | 0.75 wt. % | 0.75 wt. % |
| pH | 8.3 | 8.3 | 8.3 | 8.3 |
| Co-MRR [Å/min] | 2134 | 2076 | 1712 | 1416 |
| Co-SER [Å/min] | 49 | 79 | 54 | 44 |

| | Example 20 | Example 21 | Example 22 | Example 23 |
|---|---|---|---|---|
| Particles (A) | A1 0.5 wt. % | A1 0.5 wt. % | A1 0.5 wt. % | A1 0.5 wt. % |
| $H_2O_2$ (D) | $H_2O_2$ 1 wt. % | $H_2O_2$ 1 wt. % | $H_2O_2$ 1 wt. % | $H_2O_2$ 1 wt. % |
| Compound (B) | Terephthalic acid 0.0025 wt % | Terephthalic acid 0.005 wt % | Terephthalic acid 0.007 wt % | Terephthalic acid 0.009 wt % |
| Glycine (C) | 0.75 wt. % | 0.75 wt. % | 0.75 wt. % | 0.75 wt. % |
| pH | 8.3 | 8.3 | 8.3 | 8.3 |
| Co-MRR [Å/min] | 1608 | 1844 | 1252 | 948 |
| Co-SER [Å/min] | 64 | 80 | 52 | 49 |

| | Example 24 | Example 25 | Example 26 | Example 27 |
|---|---|---|---|---|
| Particles (A) | A1 0.5 wt. % | A1 0.5 wt. % | A1 0.5 wt. % | A1 0.5 wt. % |
| $H_2O_2$ (D) | $H_2O_2$ 1 wt. % | $H_2O_2$ 1 wt. % | $H_2O_2$ 1 wt. % | $H_2O_2$ 1 wt. % |
| Compound (B) | Trimesic acid 0.0025 wt % | Trimesic acid 0.005 wt % | Trimesic acid 0.007 wt % | Trimesic acid 0.009 wt % |
| Glycine (C) | 0.75 wt. % | 0.75 wt. % | 0.75 wt. % | 0.75 wt. % |
| pH | 8.3 | 8.3 | 8.3 | 8.3 |
| Co-MRR [Å/min] | 524 | 380 | 328 | 384 |
| Co-SER [Å/min] | 76 | 58 | 84 | 71 |

TABLE 3

Co-SER (static etching rates) [Å/min] for the CMP compositions
of the examples 5 to 15 and the comparative examples V5 to V8:

|  | Comparative Example V5 | Comparative Example V6 | Example 5 | Example 6 |
|---|---|---|---|---|
| Particles (A) | Al 0.5 wt. % | Al 0.5 wt. % | Al 0.5 wt. % | Al 0.5 wt. % |
| $H_2O_2$ (D) | $H_2O_2$ 0.5 wt. % | $H_2O_2$ 0.5 wt. % | $H_2O_2$ 0.5 wt. % | $H_2O_2$ 0.5 wt. % |
| Compound (B) | Isophthalic acid 0.001 wt % | Terephthalic acid 0.001 wt % | Isophthalic acid 0.0025 wt % | Isophthalic acic 0.01 wt % |
| Glycine (C) | 0.75 wt. % | 0.75 wt. % | 0.75 wt. % | 0.75 wt. % |
| pH | 8.3 | 8.3 | 8.3 | 8.3 |
| Co-SER [Å/min] | 118 | 273 | 37 | 11 |

|  | Example 7 | Example 8 | Example 9 | Example 10 |
|---|---|---|---|---|
| Particles (A) | Al 0.5 wt. % | Al 0.5 wt. % | Al 0.5 wt. % | Al 0.5 wt. % |
| $H_2O_2$ (D) | $H_2O_2$ 0.5 wt. % | $H_2O_2$ 0.5 wt. % | $H_2O_2$ 0.5 wt. % | $H_2O_2$ 0.5 wt. % |
| Compound (B) | Isophthalic acid 0.03 wt % | Isophthalic acid 0.05 wt % | Terephthalic acid 0.0025 wt % | Terephthalic acid 0.01 wt % |
| Glycine (C) | 0.75 wt. % | 0.75 wt. % | 0.75 wt. % | 0.75 wt. % |
| pH | 8.3 | 8.3 | 8.3 | 8.3 |
| Co-SER [Å/min] | 30 | 23 | 32 | 20 |

|  | Example 11 | Example 12 | Example 13 | Example 14 |
|---|---|---|---|---|
| Particles (A) | Al 0.5 wt. % | Al 0.5 wt. % | Al 0.5 wt. % | Al 0.5 wt. % |
| $H_2O_2$ (D) | $H_2O_2$ 0.5 wt. % | $H_2O_2$ 0.5 wt. % | $H_2O_2$ 0.5 wt. % | $H_2O_2$ 0.5 wt. % |
| Compound (B) | Terephthalic acid 0.05 wt % | 4-(Dimethyl-amino) benzoic acid 0.03 wt % | 4-(Diethyl-amino) benzoic acid 0.03 wt % | 2-(Benzylamino) benzoic acid 0.03 wt % |
| Glycine (C) | 0.75 wt. % | 0.75 wt. % | 0.75 wt. % | 0.75 wt. % |
| pH | 8.3 | 8.3 | 8.3 | 8.3 |
| Co-SER [Å/min] | 2 | 35 | 66 | 20 |

|  | Example 15 | Comparative Example V7 | Comparative Example V8 |
|---|---|---|---|
| Particles (A) | Al 0.5 wt. % | Al 0.5 wt. % | Al 0.5 wt. % |
| $H_2O_2$ (D) | $H_2O_2$ 0.5 wt. % | $H_2O_2$ 0.5 wt. % | $H_2O_2$ 0.5 wt. % |
| Compound (B) | Trimesic acid 0.03 wt % | 4-(amino-methyl) benzoic acid 0.03 wt % | 1,2,4,5-benzenetetracar-boxylic acid 0.03 wt % |
| Glycine (C) | 0.75 wt. % | 0.75 wt. % | 0.75 wt. % |
| pH | 8.3 | 8.3 | 8.3 |
| Co-SER [Å/min] | 38 | 590 | 172 |

The CMP compositions according to the invention are showing an improved polishing performance in terms of cobalt material removal rates (MRR) [Å/min] and a drastic decrease in the Co etching rates as can be demonstrated by the examples shown in table 2 and table 3.

The invention claimed is:

1. A method for chemical mechanical polishing of a surface of a (i) cobalt and/or (ii) a cobalt alloy layer present on a substrate, wherein the method comprises:
chemical mechanical polishing of said surface of the cobalt and/or cobalt alloy layer with a chemical mechanical polishing (CMP) composition, said composition comprising
(A) an inorganic particle,
(B) a substituted aromatic compound with at least one carboxylic acid function of the general formula 1 to 5 as corrosion inhibitor

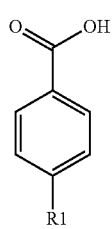

(1)

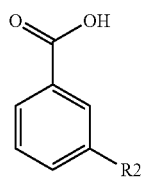

(2)

-continued

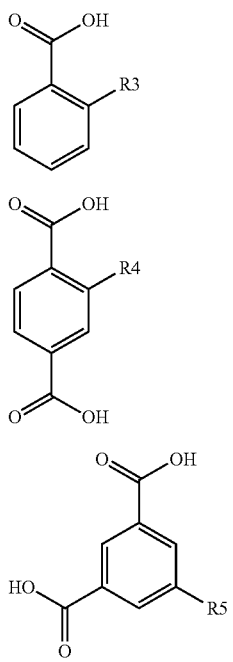

wherein $R^1$, $R^2$, $R^3$, $R^4$ and $R^5$ are independently from each other H, hydroxy, alkyl, amino, aryl alkylamino, alkylarylamino, benzylamino, carboxyl, alkylsulfonyl, sulfonic acid, sulfonate, thio or alkylthio, (C) at least one amino acid, (D) at least one oxidizer, (E) an aqueous medium, and wherein the CMP composition (Q) has a pH of from 7 to 10.

2. The method according to claim 1, wherein the inorganic particles (A) are colloidal inorganic particles.

3. The method according to claim 2, wherein the colloidal inorganic particles are silica particles.

4. The method according to claim 1, wherein the substituted aromatic compound with at least one carboxylic acid function (B) is at least one of the general formula 1 to 5, and Wherein is amino, mono-alkylamino, di-alkyamino, carboxyl, alkythio or alkylsulfonyl, $R^2$ is amino, mono-alkylamino, di-alkyamino or carboxyl, $R^3$ is benzylamino, $R^4$ is amino, mono-alkylamino, di-alkyamino and $R^5$ is amino, carboxyl or alkyl.

5. The method according to claim 1, wherein the substituted aromatic compound with at least one carboxylic acid function (B) is at least one of the general formula 1 to 5 and wherein $R^1$ is amino, mono-methylamino, di-methylamino, di-ethylamino, carboxyl or methylsulfonyl, $R^2$ is amino, mono-methylamino, di-methylamino or carboxyl, $R^3$ is benzylamino, $R^4$ is amino, and $R^5$ is amino or carboxyl.

6. The method according to claim 1, wherein a total amount of the substituted aromatic compound with at least one carboxylic acid function (B) of one of general formula 1 to S is in the range of from 0.002 wt.-% to 0.15 wt.-% based on the total weight of the respective CMP composition.

7. The method according to claim 1, wherein the at least one amino acids (C) is glycine, alanine, leucine, valine, cysteine, serine and proline or a salt thereof.

8. The method according to claim 1, wherein a total amount of the at least one amino acid (C) is in the range of from 0.1 wt.-% to 2.25 wt.-% based on the total weight of the respective CMP composition.

9. The method according to claim 1 wherein the oxidizer comprises a peroxide.

10. The method according to claim 1, wherein the oxidizer is hydrogen peroxide.

11. A chemical mechanical polishing (CMP) composition, comprising:

(A) colloidal silica particles in a total amount of from 0.01 wt.-% to 3 wt.-% based on the total weight of the respective CMP composition, (B) at least one substituted aromatic compound with at least one carboxylic acid function (B) selected from the group consisting of isophathalic acid, terephthalic acid, 2-aminoterephthalic acid, 4-methylamino benzoic acid, 4-(dimethylamino)benzoic acid, 4-methylsulfonyl benzoic acid, trimeric acid, 3-methylamino benzoic acid, 4-(diethylamino)benzoic acid, 3-dimethylamino benzoic acid and 2-(benzylamino)benzoic acid in a total amount of from 0.002 wt.-% to 0.1 wt.-% based on the total weight of the respective CMP composition, (C) at least one amino acids (C) selected from the group consisting of glycine, alanine, leucine, valine, cysteine, serine and proline and a salt thereof, in a total amount of from 0.2 wt.-% to 0.9 wt.-% based on the total weight of the respective CMP composition, (D) hydrogen peroxide in a total amount of from 0.2 wt.-% to 2 wt.-% a based on the total weight of the respective CMP composition, and (E) an aqueous medium, wherein the CMP composition (Q) has a pH of from 7 to 10.

12. A process for the manufacture of a semiconductor device, said process comprising:

chemical mechanical polishing of a surface of a cobalt and/or a cobalt alloy layer on a substrate (S) used in the semiconductor industry, in the presence of a chemical mechanical polishing CMP composition (Q);

wherein the (CMP) composition comprises (A) an inorganic particle, (B) a substituted aromatic compound with at least one carboxylic acid function of the general formula 1 to 5 as corrosion inhibitor

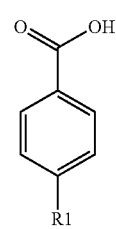

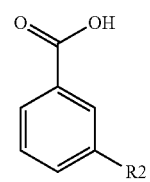

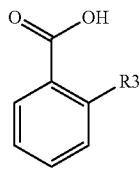 (3)

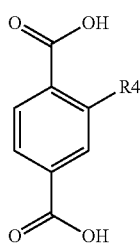 (4)

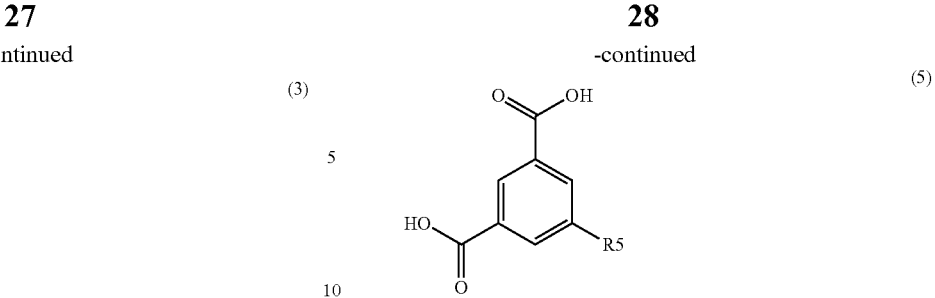 (5)

wherein $R^1$, $R^2$, $R^3$, $R^4$ and $R^5$ are independently from each other H, hydroxy, alkyl, amino, aryl alkylamino, alkylarylamino, benzylamino, carboxyl, alkylsulfonyl, sulfonic acid, sulfonate, thio or alkylthio, (C) at least one amino acid,
(D) at least one oxidizer,
(E) an aqueous medium, and
wherein the CMP composition (Q) has a pH of from 7 to 10.

13. The process according to claim 12, wherein a static etch rate (SER) of cobalt is below 100 Å/min.

14. The process according to claim 12, wherein a cobalt material removal rate (MRR) is adjusted to a range of from 300 to 7200 Å/min.

\* \* \* \* \*